United States Patent [19]
Kirkby et al.

[11] Patent Number: 5,115,444
[45] Date of Patent: May 19, 1992

[54] MULTICHANNEL CAVITY LASER

[75] Inventors: Paul A. Kirkby, Old Harlow; Ian H. White, Harston, both of United Kingdom

[73] Assignee: STC PLC, London, England

[21] Appl. No.: 625,818

[22] Filed: Dec. 11, 1990

Related U.S. Application Data

[63] Continuation-in-part of Ser. No. 439,648, Nov. 20, 1989, abandoned.

[30] Foreign Application Priority Data

Nov. 23, 1988 [GB] United Kingdom ............... 8827385

[51] Int. Cl.$^5$ .............................................. H01S 3/19
[52] U.S. Cl. ........................................ 372/50; 372/23; 372/97; 372/98; 372/102; 372/68
[58] Field of Search ..................... 372/18, 68, 97, 98, 372/102, 50, 23; 350/96.15, 96.19, 96.11

[56] References Cited

U.S. PATENT DOCUMENTS

| | | | |
|---|---|---|---|
| 3,624,551 | 11/1971 | Gudmundsen et al. | 331/94.5 |
| 3,787,779 | 1/1974 | Spitz et al. | 331/94.5 |
| 3,928,817 | 12/1975 | Chodzko | 372/95 |
| 4,309,667 | 1/1982 | Di Forte et al. | 372/50 |
| 4,318,058 | 3/1982 | Mito et al. | 372/50 |
| 4,441,186 | 4/1984 | Erickson | 372/19 |
| 4,479,224 | 10/1984 | Rediker | 372/92 |
| 4,502,144 | 2/1985 | Suhre | 372/23 |
| 4,507,790 | 3/1985 | Nettleton et al. | 372/100 |
| 4,516,837 | 5/1985 | Soref et al. | 350/96.2 |
| 4,649,351 | 3/1987 | Veldkamp et al. | 330/4.3 |
| 4,652,080 | 3/1987 | Carter et al. | 350/96.19 |
| 4,677,629 | 6/1987 | Lesh | 372/18 |
| 4,696,012 | 9/1987 | Harshaw | 372/99 |
| 4,786,133 | 11/1988 | Gidon et al. | 350/96.19 |
| 4,862,467 | 8/1989 | Carter et al. | 372/18 |
| 4,917,450 | 4/1990 | Pocholle et al. | 350/96.11 |
| 4,923,270 | 5/1990 | Carter | 350/96.18 |
| 4,978,187 | 12/1990 | Minemura et al. | 350/96.11 |

FOREIGN PATENT DOCUMENTS

| | | |
|---|---|---|
| 62-134987 | 11/1987 | Japan . |
| 1349710 | 4/1974 | United Kingdom . |
| 2152317 | 7/1985 | United Kingdom . |
| 2204404 | 9/1988 | United Kingdom . |

OTHER PUBLICATIONS

J. Mellis et al., "Miniature Packaged External-Cavity Semiconductor Lasers for Coherent Communication", 14th European Conference on Optical Communication IEEE No. 292 Part 1, Sep. 1988, pp. 219-222.

Primary Examiner—Georgia Epps
Attorney, Agent, or Firm—Lee, Mann, Smith, McWilliams & Sweeney

[57] ABSTRACT

A switchable multichannel external cavity injection laser incorporates a diffraction grating between a linear array of n reflectors and a common reflector to define a set of n optical cavities having different frequency bands. Each of the (n+1) reflectors is provided by the optically distal end of an associated semiconductor laser amplifier whose optically proximal end is arranged to be substantially non-reflective.

5 Claims, 2 Drawing Sheets

MULTICHANNEL CAVITY LASER

RELATED APPLICATIONS

This application is a continuation-in-part of U.S. patent application Ser. No. 07/439,648, filed Nov. 20, 1989.

BACKGROUND OF THE INVENTION

There have recently been several proposals for high capacity distributed switching systems that make use of the very large bandwidth and high connectivity of passive optical star networks These systems use wavelength division multiplexing to broadcast many independent channels across the whole network. They offer capacities which are orders of magnitude larger than electronic (time multiplexed) networks, complete flexibility of interconnection configuration, service transparency and almost limitless capacity for future upgrades. These advantages are attractive for distributed switching of video signals, broad band overlay for fibre optic telecommunications to domestic subscribers, high capacity inter-exchange communication, high capacity switching networks for multiprocessor computers and ultra-high-speed telecommunications packet switching. Ultimately, multichannel coherent transmitters and receivers will allow thousands of independent gigaHertz bandwidth channels to be distributed and switched between thousands of nodes. Each independent channel uses a separate wavelength and is broadcast to all the nodes on the passive network. Switching is achieved by using either fixed wavelength transmitters and tunable receivers or vice versa. In either case, the major problem limiting the number of channels in such systems is the tolerance of the control of transmitter and receiver wavelengths with respect to the defined channels. For a large number of channels the transmitter and receiver components must both have very tight tolerance on operating wavelength and must operate over the widest possible wavelength range. Consideration of the development timescales of coherent system components and likely system requirements in the 1990's suggests that a simpler system based on direct detection with up to about 50 separate channels and a few hundred nodes would find widespread application.

This invention relates to lasers, one of whose potential uses is as the transmitters of such direct detection systems. These lasers are multicavity lasers in which an individual laser has a set of optical cavities optically in parallel and includes an optically dispersive element that is common to all cavities of the set. Preferably this dispersive element is a diffraction grating. The inclusion of a diffraction grating in a single optical cavity laser is already known for instance from the paper by J. Mellis et al entitled 'Miniature Packaged External-Cavity Semiconductor Lasers for Coherent Communications', 14th European Conference on Optical Communication IEE No 292 Part 1, Sep. 1988, pp219-222, but in that instance the grating is employed to form a dispersive reflecting element at one end of a single cavity, orientation of which provides tuning of its single waveband, and is organised so that its orientation may be adjusted to provide tuning of the laser emission. That device is thus essentially a tunable single channel device rather than a switchable multichannel device.

A multichannel device is described in patent application No. GB 2 204 404 A with n individual channels. In this device a reflector which is common to all n channels is formed at or near one end of an output fibre. This common reflector faces a diffraction grating and associated imaging optics which forms a diffracted image of the reflector along the line of a linear array of n semiconductor laser amplifiers. Reflection at the end facets of the laser amplifiers which face the diffraction grating is suppressed so that the facets at the opposite (distal) end, those remote from the diffraction grating, form a set of n discrete reflectors which co-operate with the common reflector in forming a set of n external reflector semiconductor laser cavities. A characteristic of this arrangement is that the optical gain is provided optically between the diffraction grating and the set of n external reflectors, and hence the power capable of being launched into the common output channel provided by the output fibre is limited by losses associated with the diffraction grating and its imaging optics.

Another form of multichannel device is described in U.S. Pat. No. 4,696,012 (Harshaw). This device has a mirror divided up into n discrete sections, reflectors, whose reflectivities are individually controllable. These n reflectors are optically coupled, via a diffraction grating, with a single reflector to define a set of n optical cavities for which the single reflector is common. The device has a single laser amplifier which is located between the diffraction grating and the common reflector. Specifically the laser amplifier is a molecular gas laser amplifier, but other forms of laser, including solid state lasers, are expressly contemplated.

The present invention is specifically concerned with multichannel cavity lasers in which optical gain is provided by semiconductor laser amplifiers. In such semiconductor multichannel cavity lasers the inclusion of a dispersive element such as a diffraction grating within the cavities typically means that the length of each optical cavity is at least 2 cm. In consequence the longitudinal modes of any individual cavity are very closely spaced in wavelength. Typically this wavelength separation is smaller than the resolution of the grating, and also smaller than the resolution provided by the practical size of individual controllable reflectivity discrete reflectors of a multichannel laser structure of the general configuration described above with reference to the disclosure of U.S. Pat. No. 4,696,012. In consequence, more than one longitudinal mode is liable to lie within the amplification waveband for any particular physical disposition of the particular discrete reflector, the diffraction grating and the laser amplifier that is common to all the channels There is thus the potential for multimode operation. In the case of a single channel external cavity laser, multimode operation can be suppressed by fine adjustment of the position of the external reflector, or of the orientation of the grating, in order to centre a particular one of the longitudinal modes at the peak of the gain curve, and thus obviate the possibility of having no mode at the peak, but instead two competing modes equidistant down on either side of the peak. This kind of mechanical adjustment approach is not possible in the case of a multichannel cavity laser in which the relative positions of all the discrete reflectors is fixed. Multimode operation of this sort is greatly to be deprecated in most information transmission systems because of the noise it engenders

SUMMARY OF THE INVENTION

Accordingly it is a general object of the present invention to provide a semiconductor multichannel cavity laser which incorporates a structure that allows non-mechanical adjustment of the optical path length of individual cavities so as to provide a tuning facility that can be employed to suppress a tendency for multimode operation of that cavity.

It is a further object to sharply localise the optical field at each end of each cavity of a semiconductor multichannel cavity laser so as to limit the degradation of resolution provided by the dispersive element of the laser.

According to the present invention there is provided a switchable multichannel cavity laser in which a dispersive element is located in the optical path between a set of n reflectors and a common reflector so as to define a set of n optical cavities having different frequency bands, wherein each of the n optical cavities includes one of a set of n individually addressable semiconductor laser amplifiers, each having a single reflecting facet that constitutes one of said set of n reflectors, and wherein all of the optical cavities include a further semiconductor laser amplifier that is common to all n optical cavities, and has a single reflecting facet that constitutes said common reflector.

In such a multichannel cavity laser, each individual cavity includes two semiconductor laser amplifiers optically in series, and so the current drive at lasing threshold can be redistributed between the two. A particular distribution of current drive between the two amplifiers will give the lowest lasing threshold current Redistribution of the current drive will therefore require a higher aggregate drive current because the distribution is no longer optimum. Thus redistribution will therefore change the mean carrier density at lasing threshold Changing the mean carrier density changes the effective refractive index, and thus alters the optical path length of the cavity. Therefore the distribution of drive current can be adjusted between the two amplifiers to effect electrical adjustment of the optical path length of the cavity so as to shift the longitudinal modes in wavelength till one mode registers with the peak in the gain curve, thereby inhibiting multimode operation.

Another feature of such a multichannel cavity laser is that because each end of each of its cavities is provided by an end of a semiconductor laser amplifier, the optical field at such ends is sharply localised by virtue of the fact that such amplifiers have lasing filaments with highly localised cross-sectional area at their ends, and thus they contribute little to the degradation of the spectral selectivity afforded by the dispersive element.

BRIEF DESCRIPTION OF THE DRAWINGS

There follows a description of switchable multichannel cavity lasers embodying the present invention in preferred forms The description refers to the accompanying drawings in which.

DETAILED DESCRIPTION OF PREFERRED EMBODIMENTS

Figure 1:
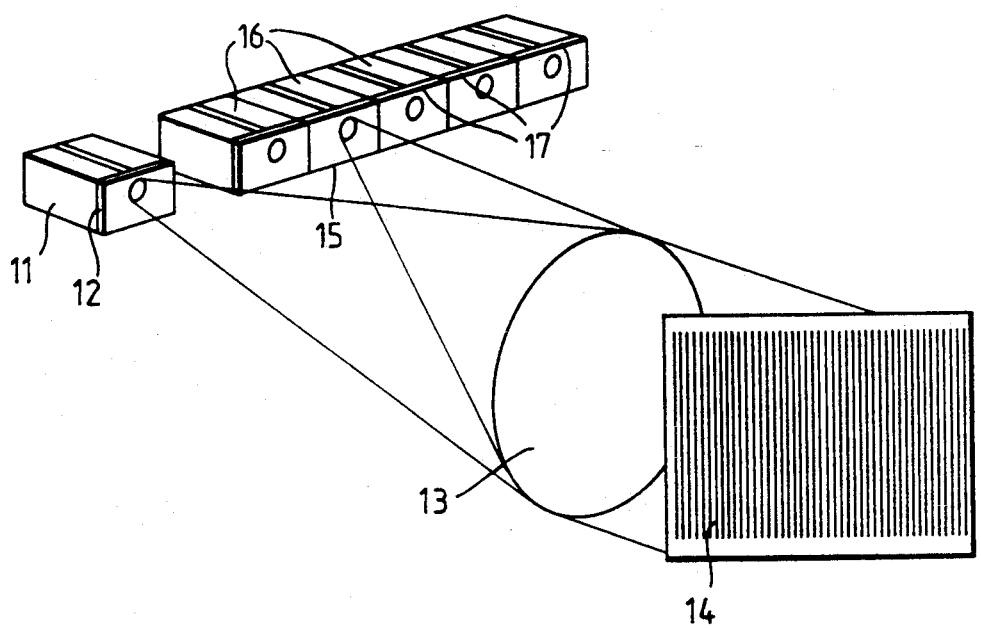
FIG. 1 depicts the basic elements of a switchable multichannel cavity laser.

Referring to FIG. 1, a semiconductor laser chip 11 is provided at one end with an anti-reflection coating 12 so as to prevent it from lasing on its own without optical feedback from an external reflector. A collimating lens 13 is located to intercept the light emitted from the anti-reflection coated end of the laser chip 11, and direct it as a collimated beam upon a reflective type diffraction grating 14. The diffracted light passes back through the lens 13 which brings the light of every wavelength to a separate focus spaced out along a line extending in a direction at right angles to the direction of linear extent of the diffracting elements of the diffraction grating 14. Along this line is positioned a linear array 15 of n laser amplifiers 16 (five are specifically illustrated in FIGS. 1 and 2) which are individually energisable. Each laser amplifier 16 of the array 15 is provided with an anti-reflection coating 17 on the end facet that faces the diffraction grating 14. When any individual laser amplifier 16 of the array is not energised it absorbs the light incident upon its anti-reflection coated facet that comes from the laser amplifier 11 by way of the diffraction grating 14. However when that individual member of the array is energised sufficiently to render it optically transparent, or energised still further to make it optically amplifying, light from the laser amplifier 11 is able to reach the distal end of that particular member of the array 15, the end without the anti-reflection coating. This distal end acts as a reflector for the light, and in this way an optical cavity is defined between this reflector and the reflector constituted by the distal end of laser amplifier 11. Thus selective energisation of the array of n laser amplifiers 16 is able to produce any of n different optical cavities, all of which have laser amplifier 11 in common, but each of which has its individual laser amplifier 16. Each of these cavities has a pass band whose spectral width is determined by the resolution afforded by the diffraction grating 14 and the optically effective width of both its own particular laser amplifier 16 and that of the laser amplifier 11 that is common to all the cavities. These pass bands are spaced out in the spectrum by virtue of the lateral spread of laser amplifiers 16 in the array 15.

Although the individual laser amplifiers 16 of the array 15 are represented in the FIG. as being constituted by discrete chips, they can be provided as integrated items forming part of a monolith in array. Such an array may also include the common laser amplifier 11.

Figure 2:
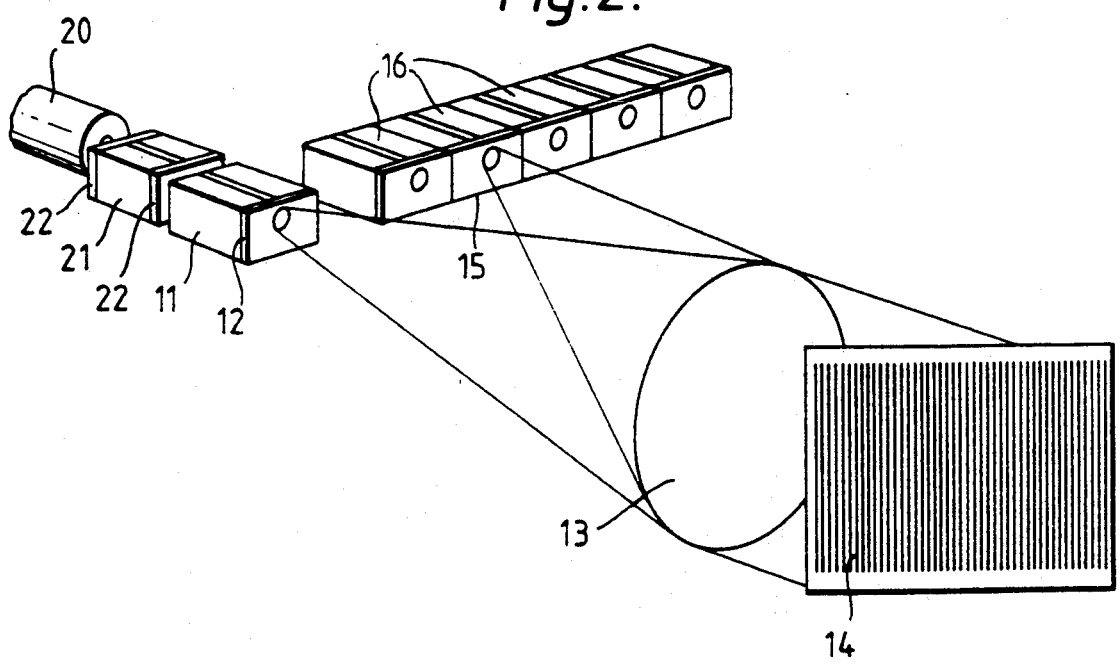
FIG. 2 depicts the laser of FIG. 1 coupled to an optical fibre via a modulator.

By energising just one of the laser amplifiers 16 to make just one single optical cavity, the multichannel cavity laser can be caused to lase at a frequency lying within the spectral pass band of that cavity. As explained previously, the current drive necessary to produce lasing of any particular cavity may be partitioned between its laser amplifier 16 and the common laser amplifier 11 in such a way as to provide for the optical cavity an optical path length for which one of its longitudinal modes lies at the peak in the gain curve so as to inhibit multimode operation. The amplitude of this light can be modulated in the way that a conventional injection laser is modulated, namely by modulation of the injected current but, since this laser is an external cavity laser with a relatively long optical path distance between its reflectors, the speed of modulation that can be achieved by this method is limited. Thus a 30 mm external cavity device would be limited to a maximum direct modulation rate of about 500 MHz. For higher speed modulation recourse must be had to the use of a separate modulator positioned outside the laser cavities One possible arrangement is as depicted in FIG. 2 which shows the laser of FIG. 1 coupled to an optical fibre 20 via a modulator 21 provided with anti-reflection coatings 22. An example of a suitable modulator for this purpose is a waveguide electro-absorption modulator. An example of this type of modulator operated up to a speed in excess of 10 GHz is described for instance in the paper by H. Soda et al entitled 'High-Speed GaInAsP/InP Buried Heterostructure Optical Intensity Modulator with Semi-Insulating InP Burying Layers' Electronics Letters Vol. 23 No 23 pp 1232-1234 (5 Nov. 1987).

Clearly, if only one laser amplifier 16 in the array 15 is energised at any one instant in time, then the multichannel laser emits in only one of the n wavebands at any particular instant. On the other hand, two or more laser amplifiers 16 can be simultaneously energised, and in particular, if the energisation of each laser amplifier 16 of the array 15 is arranged to be modulation in binary fashion, then such binary modulation of these laser amplifiers 15 may be used to transmit byte-wide information in the wavelength domain. The switchable multichannel cavity laser is thus capable of functioning as a device for transforming spatially parallel binary information applied to the individual members of the array of laser amplifiers 16 into a parallel stream of light pulses directed along a single channel, for instance a single optical fibre, with the binary information coded in the wavelength domain. This transformation from spatial parallel to wavelength parallel has potential applications in optoelectronic processing machines.

Figure 3:
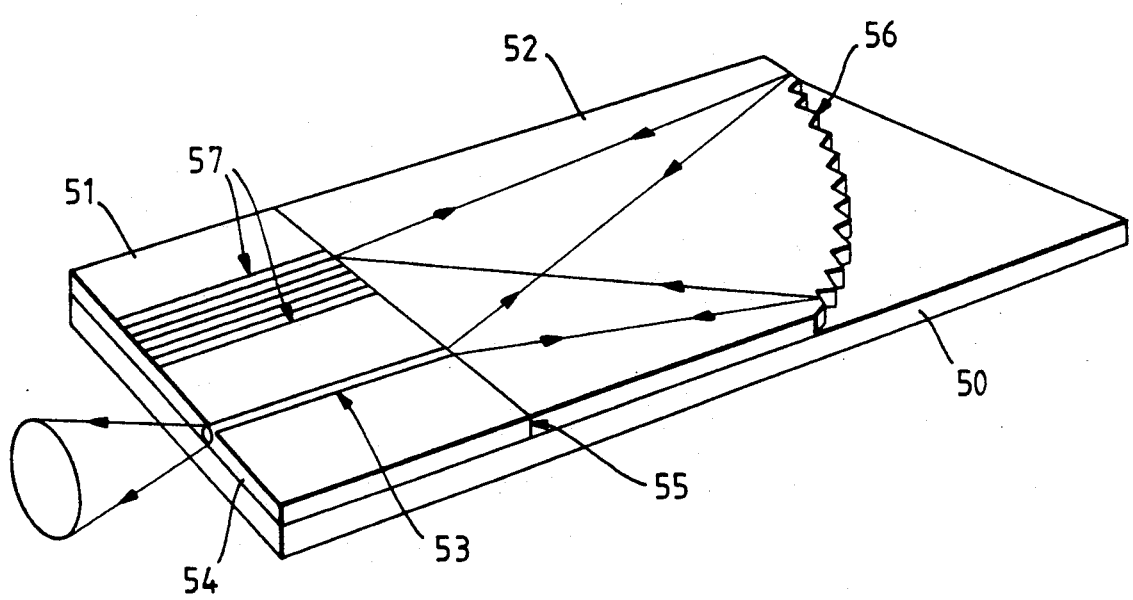
FIG. 3 depicts an integrated version of laser of FIG. 1.

A monolithic version of the laser of FIG. 1 is depicted in FIG. 3. An InP substrate 50 is provided with an active waveguide region 51 and a passive waveguide region 52. The active waveguide portion includes a laser amplifier constituted by a two-dimensional waveguide 53 which can be electrically driven to render it optically amplifying. Light propagating in this waveguide in the direction away from the end facet 54, which is a relatively high reflectivity facet, enters the passive region 52 suffering minimal reflection at the interface 55 because of substantial matching of the optical properties at this interface. The passive region 52 is a one-dimensional guide and is made of material which is transparent within the optically amplifying waveband of the waveguide 53, and so the light spreads out laterally in its passage towards the far end of the passive region 52 where it is reflected and diffracted by the facets of a one-dimensional diffraction grating 56. This is not a plane grating, but is a concave grating whose curvature is such as to diffract the incident divergent light back to a focus at the interface 55. Measuring from the inner end of amplifying waveguide 53, the distance along the interface 55 of this focus is a function of wavelength. At the appropriate distances for the required set of n wavebands are located the inner ends of a set of n laser amplifiers constituted by n two-dimensional waveguides 57 formed in the active waveguide region 51, each of which can be independently driven to render it optically amplifying, and each of which has substantially the same structure as that of the laser amplifier waveguide 53.

The passive waveguide 52 of the device of FIG. 5 can be fabricated in semiconductive material that is lattice matched with the substrate 50 and has the appropriate composition to be transparent over the requisite wavebands. A potential disadvantage of this approach is the temperature sensitivity that results from the relatively large thermal coefficient of refractive index of semiconductive material compared with that of silica. In applications for which this temperature sensitivity presents problems it would therefore be preferable to construct the passive waveguide 52 of silica rather than of semiconductive material. If an acceptable quality silica passive waveguide 52 can not be formed on an InP substrate it may be necessary to depart from a wholly monolithic structure for the entire device, leaving the active waveguide region 51 and the array of two-dimensional waveguides 57 as component parts of a monolithic structure that is aligned with the silica passive waveguide 52 formed as a separate entity This silica passive waveguide may for instance be formed on a silicon substrate.

We claim:

1. A switchable multichannel cavity laser having a plurality of n optical resonant cavities defined between a set of n reflectors and a common reflector, wherein a dispersive element is located between the set of n reflectors and the common reflector so as to provide the n optical cavities with different frequency bands, wherein each of the n optical cavities includes one of a set of n individually addressable semiconductor laser amplifiers, each having a single reflecting facet that constitutes one of said set of n reflectors, and wherein all of the optical cavities include a further semiconductor laser amplifier that is common to all n optical cavities and that has a single reflecting facet that consitutes said common reflector.

2. A switchable multichannel cavity laser as claimed in claim 1, wherein the dispersive element is a diffraction grating.

3. A switchable multichannel cavity laser as claimed in claim 1, wherein the set of n semiconductor laser amplifiers and the further semiconductor laser amplifier form at least part of a monolithic structure.

4. A switchable multichannel cavity laser as claimed in claim 3, wherein the dispersive element is a diffraction grating.

5. A switchable multichannel cavity laser as described in claim 4, wherein the diffraction grating also forms part of the monolithic structure.

* * * * *